(12) United States Patent
Perner

(10) Patent No.: US 7,102,917 B2
(45) Date of Patent: Sep. 5, 2006

(54) MEMORY ARRAY METHOD AND SYSTEM

(75) Inventor: Frederick A. Perner, Santa Barbara, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 26 days.

(21) Appl. No.: 10/934,718

(22) Filed: Sep. 3, 2004

(65) Prior Publication Data

US 2006/0050551 A1 Mar. 9, 2006

(51) Int. Cl.
- G11C 11/00 (2006.01)
- G11C 5/08 (2006.01)
- G11C 11/15 (2006.01)
- G11C 7/10 (2006.01)
- G11C 5/14 (2006.01)
- G11C 7/02 (2006.01)

(52) U.S. Cl. .................. 365/158; 365/66; 365/173; 365/189.02; 365/189.09; 365/207; 365/209

(58) Field of Classification Search ........... 365/159, 365/171, 173, 66, 158
See application file for complete search history.

(56) References Cited

U.S. PATENT DOCUMENTS

| 2005/0007816 A1* | 1/2005 | Smith et al. ............... 365/171 |
| 2005/0041517 A1* | 2/2005 | Smith et al. ............... 365/232 |
| 2005/0226071 A1* | 10/2005 | Beers et al. ............... 365/209 |

* cited by examiner

*Primary Examiner*—Amir Zarabian
*Assistant Examiner*—Ly Duy Pham

(57) ABSTRACT

An MRAM memory array includes a set of memory cell strings wherein each memory cell string has a voltage divider input, a bit-sense output, a voltage divider ground, and a bit-sense output control, a shared switched voltage line that is capable of applying a voltage to the voltage divider inputs of the memory cell strings in the set, a common bit-sense line operatively coupled to the bit-sense outputs of the memory cell strings, a bit-sense output control line that is capable of selectively connecting the bit-sense output of a memory cell string to the common bit-sense line, and a ground operatively coupled to the voltage divider grounds of the voltage divider grounds.

6 Claims, 9 Drawing Sheets

FIG. 2A  FIG. 2B

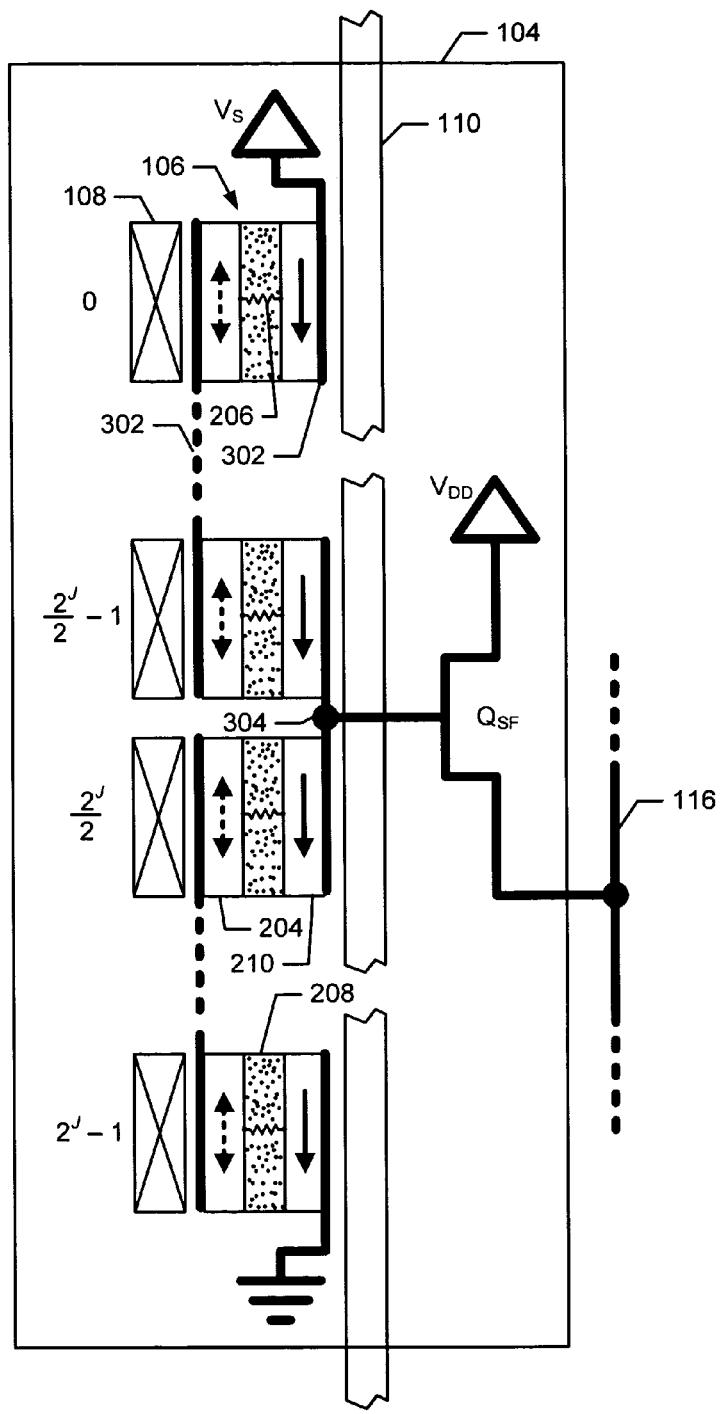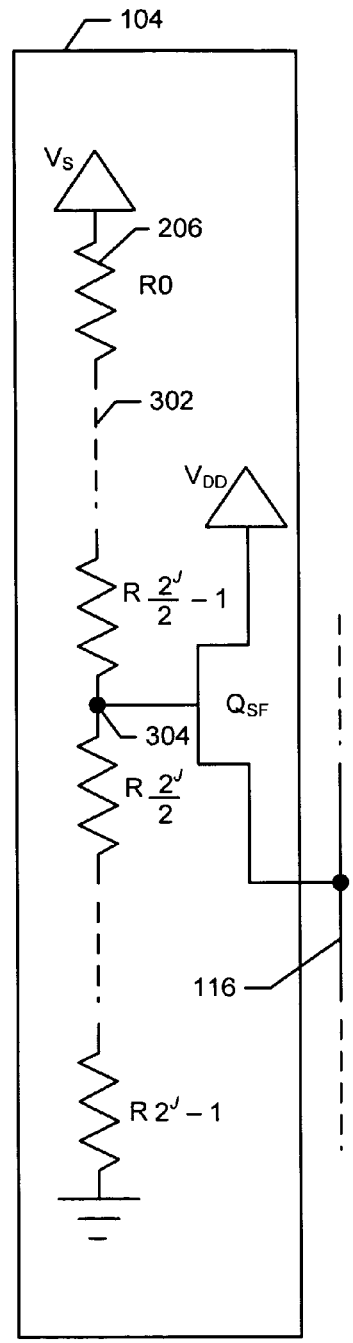
FIG. 3A
FIG. 3B

MEMORY ARRAY METHOD AND SYSTEM

BACKGROUND

The present invention relates to magnetic random access memories (MRAMs). Electronic appliances such as personal computers use electronic memory for data and program storage. Information is represented as bit patterns in the memory. Each bit can have two states, often referred to as a logical 0 and a logical 1 or just simply as 0 and 1.

Electronic memory often takes the physical form of a small silicon die contained within a plastic or ceramic package for physical protection. The silicon die contains the electronic circuitry of the memory and is a small piece of a larger silicon wafer, which allows a large number of memory "chips" to be manufactured together. Desirable characteristics for computer memory chips are random access, low cost, low power, high density, high speed, and writability. Often one characteristic is obtained at the expense of another. For example, extremely high-speed memory might not be low-cost, high-density, or low-power. Two types of electronic memory are frequently used in personal computers. One is dynamic random access memory (DRAM) and the other is static random access memory (SRAM).

DRAM has the characteristics of random access, low cost, moderate power, high density, moderate speed, and writability. The high density and low cost of DRAM are achieved by using tiny capacitors to store electrical charges representing the states of the bits in the memory. Unfortunately, this technique requires complex control circuitry to continually refresh the stored charges on the capacitors. If the charges are not refreshed, they leak away and the data they represent are lost. Continual refreshing of the stored charges results in increased power dissipation even when the memory is not being used, which is problematic for portable computing devices like laptop computers.

SRAM on the other hand, uses latching circuitry to store the states of the bits in the memory. Latching circuitry eliminates the need for complex refresh circuitry and allows SRAM to have very high speed. Unfortunately, the high speed is obtained at the expense of high density due to the increased amount of chip area required by the latching circuitry to store each bit. The lower density also leads to higher cost for SRAM. The extra circuitry used to store each bit also dissipates a large amount of power.

Another shortcoming of DRAM and SRAM is that they are both volatile memory technologies and so lose their stored data when power is removed. Volatile memory is problematic for portable electronic devices like laptop computers. To overcome the problem of volatility, a laptop computer writes the state of its memory to a magnetic storage disk before turning off the power. When the power is turned back on, the operating system and the programs that were previously in use must be restored to the electronic memory. This "boot up" delay is frustrating to many users and could be essentially eliminated if the electronic memory were non-volatile.

Flash memory mitigates the volatility problem for some portable electronic devices like cell phones and digital cameras. Flash memory is a type of EEPROM (electrically erasable programmable read only memory) where a bit of information is stored as a charge on an electrically isolate gate of a field effect transistor. The electrical isolation of the gate prevents the charge from leaking away and effectively makes the memory non-volatile. However, there are characteristics of flash memory that are problematic for its use as the memory of a personal computer. The first characteristic is that the memory has a limited number write/erase cycles. Secondly, to erase bits, a large section of memory is erased in a "flash," which leads to its name.

MRAM is a non-volatile memory technology that relies on the relative magnetic orientations of two magnetic layers sandwiched on either side of a magnetoresistive layer to store data. When the magnetic orientations are parallel, the magnetoresistive layer has a low resistance and when they opposite (often termed anti-parallel), the magnetoresistive layer has a higher resistance. Circuitry on the chip can sense the resistance of a single bit cell and interpret the high or low resistance as either a binary 1 or 0. Since power is not required to maintain the magnetizations, data are retained in the bit cells when power is removed. This yields the non-volatile characteristic of MRAM technology as well reducing its power consumption.

MRAM technology also has other desirable characteristics. It has potential for high density due to the simplicity of the bit cell. Unlike DRAM, which also has a simple bit cell, MRAM does not require complex refresh circuitry. This leads to simpler memory system design and lower system cost. MRAM is also inherently high-speed due to the simplicity of the bit cell.

It is desirable to decrease the cost/performance ratio by making MRAM chips as small as possible. Making smaller MRAM chips smaller increases the number of chips manufactured on a single wafer, thereby generally lowering the unit cost of the chip. Smaller chips generally result is higher performance due less stray capacity associated with smaller feature sizes and shorter line lengths.

Accordingly, there is a need for MRAM chip designs that lend themselves to smaller physical implementations, thereby reducing the size of an individual MRAM chip.

BRIEF DESCRIPTION OF THE DRAWINGS

The present invention is illustrated by way of example and not limitation in the figures of the accompanying drawings in which:

FIG. 2A is a diagram of a magnetoresistive memory cell in a parallel state in accordance with one implementation of the present invention;

FIG. 2B is a diagram of a magnetoresistive memory cell in an anti-parallel state in accordance with one implementation of the present invention;

FIG. 3A is a diagram of a memory cell string in accordance with one implementation of the present invention;

FIG. 3B is a schematic diagram of a memory cell string in accordance with one implementation of the present invention;

Like reference numbers and designations in the various drawings indicate like elements.

SUMMARY OF THE INVENTION

One aspect of the present invention features an MRAM memory array, including a set of memory cell strings wherein each memory cell string has a voltage divider input, a bit-sense output, a voltage divider ground, and a bit-sense output control. A shared switched voltage line is operatively coupled to the voltage divider inputs of the memory cell strings in the set. A common bit-sense line is operatively coupled to the bit-sense outputs of the memory cell strings in the set. A bit-sense output control line is operatively coupled to the bit-sense output control of each memory cell string in the set and a ground is operatively coupled to the voltage divider grounds of the memory cell strings.

Another aspect of the present invention features a method of fabricating an MRAM memory that includes coupling a shared switched voltage line to the voltage divider inputs of the set of memory cell strings, coupling a common bit-sense line to the bit-sense outputs of the set of memory cell strings, coupling a bit-sense output control line to the bit-sense output control that connects the bit-sense output of a memory cell string to the common bit-sense line and coupling a ground to the voltage divider grounds of the set of memory cell strings.

DETAILED DESCRIPTION

Implementations of the present invention concern achieving high-density MRAM by reducing the physical size of an individual MRAM chip. Chip size reduction is obtained by sharing various chip components such as voltage lines that power individual memory cells on the chip.

Aspects of the present invention are advantageous in at least one or more of the following ways. Reducing MRAM chip size means that more chips can be manufactured on a single wafer. Since wafer costs are generally fixed for a given process, reducing the chip size results in a reduction of the unit cost for each chip. Smaller chips generally have higher performance due to a reduction of on-chip distances that signal lines must travel. Longer signal lines result in greater stray capacity, which generally slows signal propagation times and lowers overall chip performance.

Figure 1:
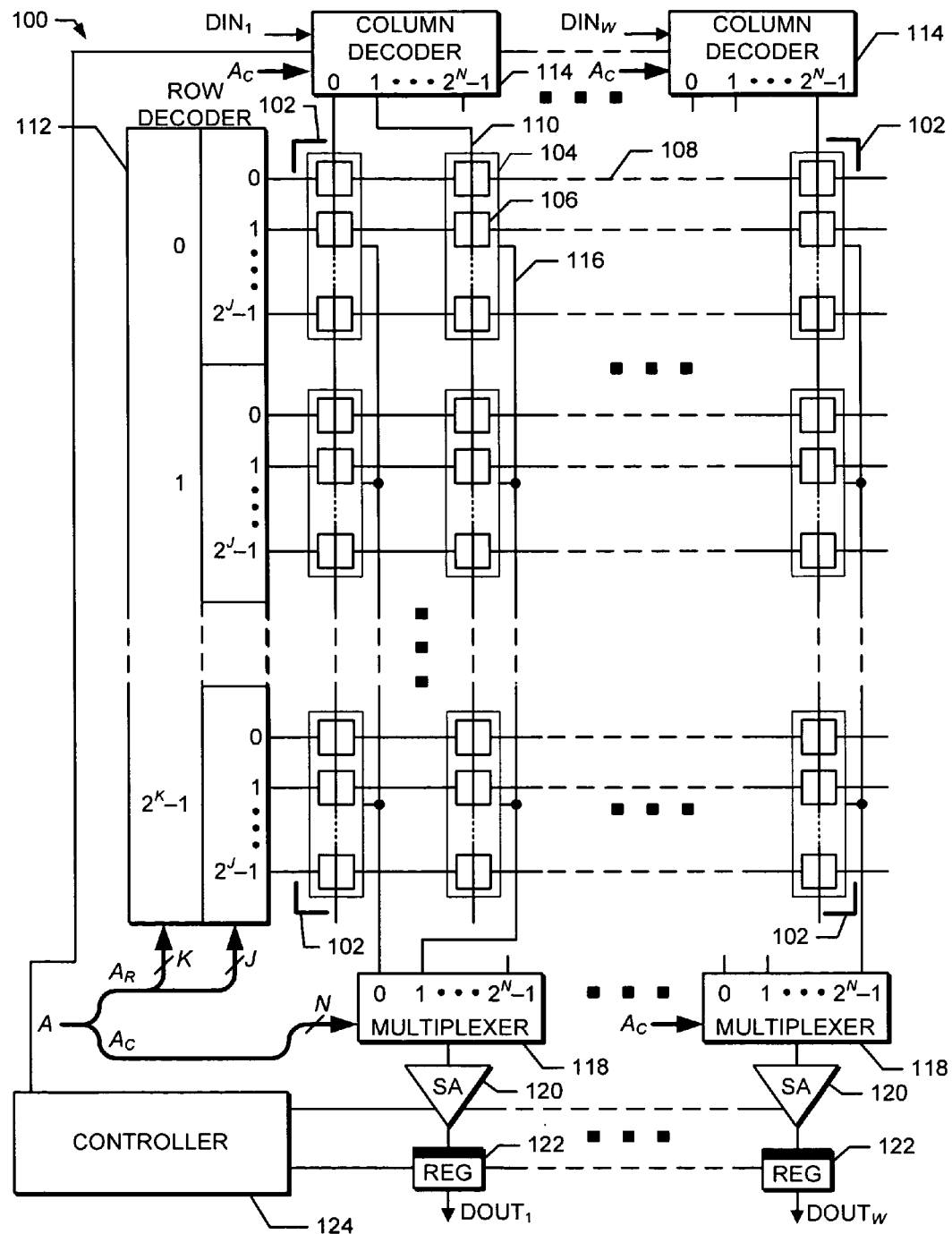
FIG. 1 is a diagram of an exemplary MRAM memory system in accordance with one implementation of the present invention.

Turning first to FIG. 1, an exemplary MRAM memory system 100 designed in accordance with one implementation of the present invention is illustrated. Memory system 100 uses binary address decoding. Memory system 100 includes an array 102, (delineated by angle brackets) of memory cell strings 104. Each memory cell string 104 includes two or more memory cells 106. A horizontal word line 108 and a vertical bit line 110 cross each memory cell 106. A row decoder 112 drives word lines 108 and column decoders 114 drive bit lines 110. Each memory cell string 104 has a voltage divider output connected to a bit sense line 116. A single bit-sense line 116 is selected by a multiplexer 118 and connected to the input of a sense amplifier 120. The output of sense amplifier 120 is connected to the input of an output data register 122. A controller 124 is connected to and operates column decoders 114, multiplexers 118, sense amplifiers 120, and data output registers 122.

Memory system 100 has a word width of W bits, numbered 1 to W, and a memory address input A. Memory address A is divided into row and column address components $A_R$ and $A_C$ respectively. $A_C$ is N bits wide and $A_R$ is K+J bits wide. Accordingly, memory system 100 has a capacity of $2^{(N+J+K)}$ W-bit words. It follows that each memory cell string 104 has $2^J$ memory cells 106 and there are $2^K$ rows of memory cell strings 104 in array 102.

Array 102 is divided into W bit-groups. Each bit group includes $2^N$ columns of memory cell strings 104. There are W column decoders 114 (one for each bit group), each with $2^N$ vertical bit lines 110. Each column decoder 114 is controlled by its associated data input bit DIN and address component $A_C$. There are W data input lines $DIN_{1-W}$.

There are also W multiplexers 118, each selecting one of $2^N$ bit sense lines 116 from a bit group under the control of address component $A_C$. Each multiplexer 118 drives associated sense amplifier 120, which in turn drives associated single-bit output data register 122. Each output data register has an output DOUT. There are W data output lines $DOUT_{1-W}$ when taken together form the word of width W.

Writing data $DIN_{1-W}$ to address A involves decoding the $A_R$ component of A with row decoder 112 to activate a word line 108. Each of column decoders 114 decodes the $A_C$ component of address A. The DIN bit connected to each column decoder 114 controls the direction of current flow in decoded bit line 110. When an active word line 108 and an active bit line 110 cross a memory cell 106, the memory cell magnetization direction changes according to the direction of current flow in bit line 110 and a bit is written. The direction of the magnetization of memory cell 106 affects its resistance and the resistance of an individual memory cell 106 affects the voltage output from its associated memory cell string 104. The voltage output from the memory cell string represents the content of the data written.

Reading data stored at address A involves a different sequence of steps. First, row decoder 112 decodes the K-bit portion of the $A_R$ component of A to select a row of memory cell strings 104. Selecting a row causes the voltage divider output of memory cell string 104 to be placed on bit sense line 116. Multiplexer 118 selects a bit sense line 116 according to the $A_C$ component of memory address A. A first voltage on bit sense line 116 is routed through multiplexer 118 to sense amplifier 120. Controller 124 causes sense amplifier 120 to store the first voltage for later reference.

Next, controller 124 writes a known state, i.e., either a logical 1 or 0, into memory cells 106 at address A. Then, as previously described, a second voltage is read from the selected row and routed through multiplexer 118 to sense amplifier 120 where controller 124 then causes sense amplifier 120 to compare the second voltage with the stored first voltage. In one implementation of the present invention, the output of sense amplifier 120 indicates with a logical 1 that the stored first voltage is different from the second voltage resulting from writing a known state to memory cell 106. For example, if the known logical state written to memory cell 106 is a logical 0, then the output of sense amplifier 120 will contain a logical 1 if the stored first voltage is different from the second voltage or a logical 0 if the stored first voltage and second voltage are essentially the same. Put alternatively, the output of sense amplifier 120 contains the data that was in memory cell 106 before it was written with the known logical state. Controller 124 then causes the output of sense amplifier to be latched and transferred to output register 122 where it is held until the next read operation.

FIG. 2A is a diagram of a magnetoresistive memory cell 106 in a parallel state in accordance with one implementation of the present invention. Memory cell 106 includes an insulating tunnel barrier 208 sandwiched between a pinned magnetic layer 210 and a free magnetic layer 204. Alternatively, the pinned layer may be substituted instead with what is referred to as a reference layer. In an alternate implementation of the present invention, an MRAM structure uses a soft reference layer rather than pinned magnetic layer 210. The alignment of the magnetization of the soft reference layer is established when a current is applied to either the selected row or selected column. The magnitude of the applied current is large enough to establish a reference magnetization in the soft reference layer but small enough to not disturb data in the free layers. The advantage of using the soft reference layer is the data may be sensed without writing or toggling the free layer as part of a multi-sample read. Implementations of the present invention work well with either a pinned or soft reference layer.

Insulating tunnel barrier 208 has a resistance 206 that is a function of the relative magnetization orientations of pinned magnetic layer 210 and free magnetic layer 204. Pinned magnetic layer 210 is termed "pinned" because its magnetization 212 is oriented in a plane and fixed so as to not rotate in the presence of an applied magnetic field below a predetermined level. Free magnetic layer 204 is termed "free" because its magnetization 202 can be readily oriented in one of two directions along a preferred magnetic axis often termed the "easy" axis. Since free magnetic layer 204 and pinned magnetic layer 210 have the same magnetic orientations, cell 106 is termed to be in the "parallel" state.

FIG. 2B is a diagram of a magnetoresistive memory cell 106 in an anti-parallel state in accordance with one implementation of the present invention. The state of memory cell 106 is termed "anti-parallel" because the magnetic orientation 202 of free magnetic layer 204 is different from the magnetic orientation 212 of pinned magnetic layer 210.

Insulating tunnel barrier 208 separates free magnetic layer 204 and pinned magnetic layer 210. Because insulating tunnel barrier 208 is extremely thin, quantum mechanical tunneling occurs occur between free magnetic layer 204 and pinned magnetic layer 210. This tunneling phenomenon results in an apparent resistance 206 between free magnetic layer 204 and pinned magnetic layer 210. Further, the tunneling phenomenon is electron spin dependent so resistance 206 of insulating tunnel barrier 208 is a function of the relative magnetic orientations of free magnetic layer 204 and pinned magnetic layer 210. In general, the anti-parallel state has a higher resistance 206 than the parallel state.

A single bit of information is stored in memory cell 106 by causing the relative orientation of free magnetic layer 204 to be either parallel or anti-parallel. For example, parallel could indicate the storage of a logical 1 and anti-parallel could indicate the storage of a logical 0, or vice versa. Memory cell 106 is non-volatile because its free magnetic layer 204 and pinned magnetic layer 210 retain their relative magnetic orientation when power is removed.

Figure 2C:
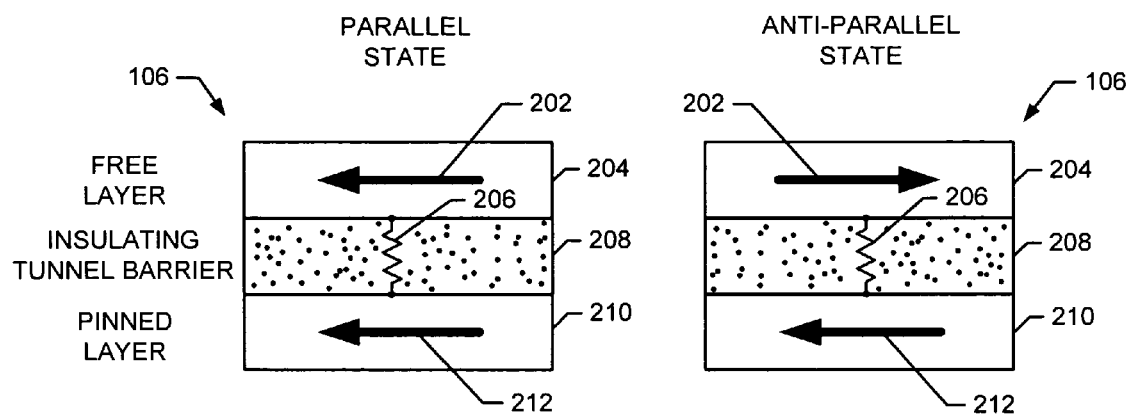
FIG. 2C is a diagram of a write operation to a magnetoresistive memory cell in accordance with one implementation of the present invention.
Figure 2C:
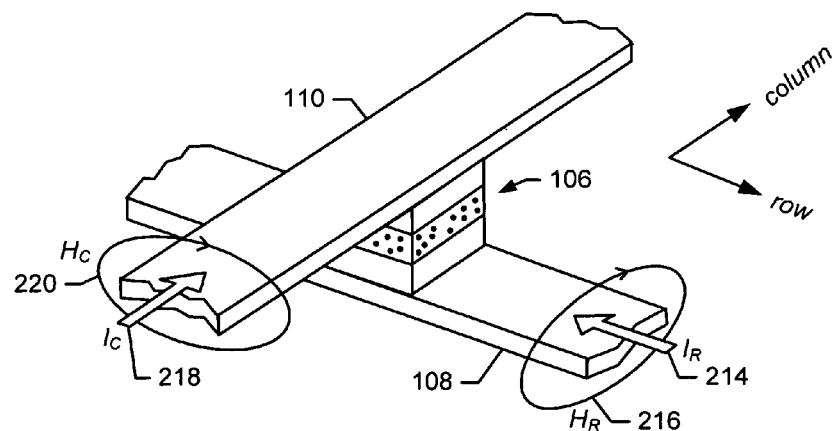

FIG. 2C is a diagram of a write operation to a magnetoresistive memory cell 106 in accordance with one implementation of the present invention. Memory cell 106 is crossed at substantially right angles by word line 108 and bit line 110. Orienting free magnetic layer 204 of memory cell 106 to either the parallel or anti-parallel state effects a write operation. The magnetization 202 of free magnetic layer 204 of selected memory cell 106 is oriented by applying a current $I_R$ 214 to a word line 108 and a current $I_C$ 218 to a bit line 110 that are both coincident with memory cell 106.

A magnetic field $H_R$ 216 is associated with the current $I_R$ 214 flowing in word line 108. Similarly, a magnetic field $H_C$ 220 is associated with the current $I_C$ 218 flowing in bit line 110. When current $I_R$ and current $I_C$ are of a predetermined magnitude, the combination of their respective magnetic fields $H_R$ and $H_C$ will cause magnetic orientation 202 of free magnetic layer 204 to rotate from parallel to anti-parallel or vice versa. The current magnitudes are selected so that their combined magnetic field is able to rotate magnetic orientation 202 of free magnetic layer 204 without disturbing magnetic orientation 212 of pinned magnetic layer 210. The direction of current $I_C$ in bit line 110 determines the direction of magnetic orientation 202 of free magnetic layer 204.

FIG. 3A is a diagram of a memory cell string 104 in accordance with one implementation of the present invention. Memory cell string 104 includes $2^J$ memory cells 106 connected in series by metallization links 302 to form a voltage divider between switched voltage source $V_S$ and ground. Memory cells 106 are numbered 0 to $2^J-1$. The middle-two cells are numbered $2^J/2-1$ and $2^J/2$ respectively. For example, if J is equal to 3 then there are $2^3$ or 8 memory cells 106 per memory cell string 104 with the cells numbered from 0 to 7 and the middle-two cells numbered 3 and 4 respectively. Each memory cell 106 is crossed at right angels by a vertical bit line 110 and a horizontal word line 108. Junction 304, located at the midpoint of the series of memory cells 106, is connected to the gate of transistor $Q_{SF}$, configured as a source follower. The drain of transistor $Q_{SF}$ is connected to voltage source $V_{DD}$. The source of transistor $Q_{SF}$ is connected to bit sense line 116.

As previously described, memory cell 106 includes insulating tunneling barrier 208 sandwiched between pinned magnetic layer 210 and free magnetic layer 204. The resistance 206 of insulating tunneling barrier 208 is a function of the orientation of the magnetization of free magnetic layer 204. Electrically, memory cell 106 can be modeled as a resistor with resistance 206 in which pinned magnetic layer 210 and free magnetic layer 204 each forms a terminal of the resistor. The voltage divider is formed by connecting pinned magnetic layer 210 of a first memory cell, numbered 0, to switched voltage source $V_S$ and connecting free magnetic layer 204 of the first cell to free magnetic layer 204 of a second, adjacent cell. Pinned magnetic layer 210 of the second cell is connected to pinned magnetic layer 210 of a third cell, adjacent to the second cell. The connection pattern is repeated until a final cell is reached, whereupon pinned magnetic layer 210 of the final cell is connected to ground.

FIG. 3B is a schematic diagram illustrating memory cell string 104 in accordance with one implementation of the present invention. As previously described, memory cell string 104 is effectively a string of resistors, labeled R0 to $R2^J-1$, that form a voltage divider between switched voltage source $V_S$ and ground. Each resistor has a resistance 206 that is a function of the magnetic orientation of the free magnetic layer of its associated memory cell. The voltage divider output is taken from its midpoint 304 operatively connected to the gate of transistor $Q_{SF}$, configured as a source follower. The drain of transistor $Q_{SF}$ is connected to $V_{DD}$ and the source is connected to bit sense line 116. A source follower configured transistor provides extra drive capability necessary for driving bit sense line 116 and also provides isolation of the resistor string from resistor strings of other memory cell strings 104 also connected to bit sense line 116.

When any of memory cells 106 associated with memory cell string 104 are read, switched voltage source Vs is turned on, otherwise, it is at ground potential and switched voltage source Vs is off. As previously described, the magnetic orientation of the free magnetic layer associated with each memory cell is a function of the bit stored in the cell. For example, a binary 1 causes the orientation to point in one direction along the free magnetic layer's easy axis and a binary 0 causes the orientation to point in the opposite direction. There is a different resistance 206 for each orientation. Changing a cell's state changes its resistance, which is reflected as a voltage change at voltage divider midpoint 304 and conveyed by source-follower transistor $Q_{SF}$ to bit sense line 116.

Figure 4A:
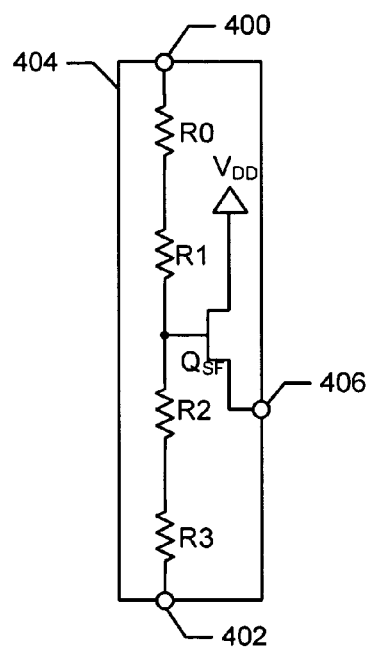
FIG. 4A is a diagram of a memory cell string in accordance with one implementation of the present invention.

FIG. 4A is a diagram of a memory cell string 404 in accordance with one implementation of the present invention. Memory cell string 404 includes a voltage divider formed by four resistors R0–R3. Resistor R0 is coupled to voltage divider input 400 and to resistor R1. Resistor R1 is coupled jointly to the gate of source-follower transistor $Q_{SF}$ and to resistor R2. Resistor R2 is coupled to resistor R3, which is coupled to voltage divider ground 402. The drain of transistor $Q_{SF}$ is coupled to VDD and its source is coupled to bit-sense output 406.

Resistors R0–R3 represent the resistances of the insulating tunneling barriers of the four magnetoresistive memory cells forming memory cell string 404. As previously described, the resistance of a magnetoresistive memory cell depends upon the state of the bit stored therein. Different bit states cause voltage variations at the junction of resistors R1 and R2. The gate of transistor $Q_{SF}$ senses the voltage variation and transfers it to its source, which is coupled to bit-sense output 406.

Figure 4B:
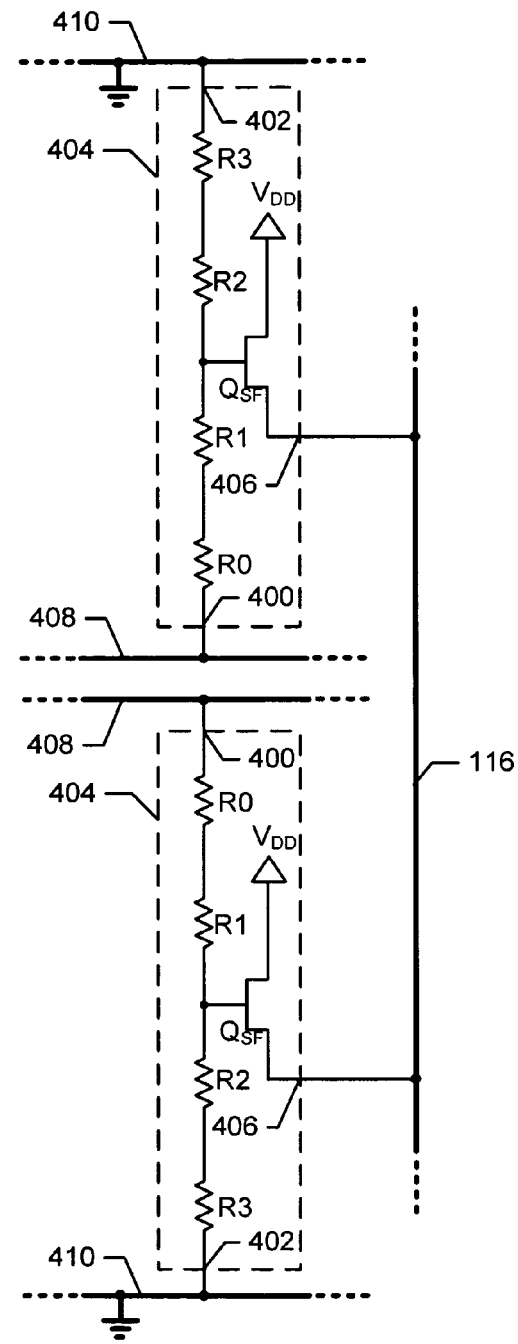
FIG. 4B is a diagram of a set of memory cell strings in accordance with one implementation of the present invention.

FIG. 4B is a diagram of a set of memory cell strings 404 in accordance with one implementation of the present invention. Memory cell strings 404 share a common bit-sense line 116 rather than using independent bit-sense lines for each individual memory cell string. By sharing bit-sense line 116, the set of memory cell strings 404 can be fabricated more densely. The voltage divider input of each memory cell string 404 is coupled to a switched voltage line 408 that is capable of applying a voltage to the voltage divider input. Selectively applying a voltage to the voltage divider input selects its associated memory cell string 404 and secures access to common bit-sense line 116 shared amount memory cell strings 404. The voltage divider ground of each memory cell string 404 in the set is operatively coupled to a ground 410. A common bit-sense line 116 is operatively coupled to the bit-sense outputs 406 set of memory cell strings 404.

In one implementation, the set of memory cell strings 404 is arranged in a matrix of rows and columns. In the matrix, common bit-sense line 116 is operatively coupled to bit-sense outputs 406 along a column of the matrix. Also in the matrix, switched voltage line 408 is operatively coupled to voltage divider inputs 400 of memory cell strings along a row of the matrix. Common bit-sense line 116 may be operatively coupled to a sense amplifier, or multiple common bit-sense lines 116 operatively coupled to a sense amplifier through a multiplexer. Unselected switched voltage lines 408 are set to ground potential in one implementation.

Figure 5A:
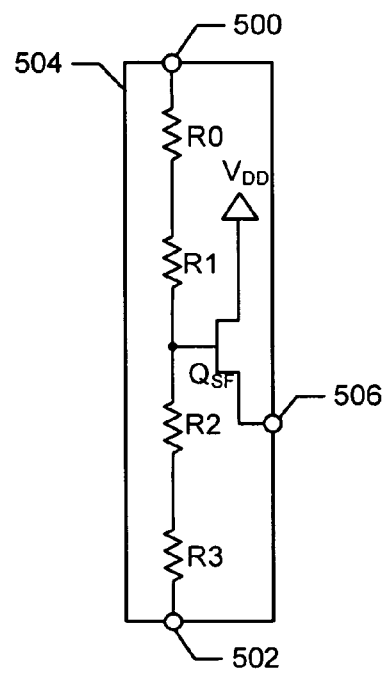
FIG. 5A is a diagram of a memory cell string in accordance with one implementation of the present invention.
Figure 5B:
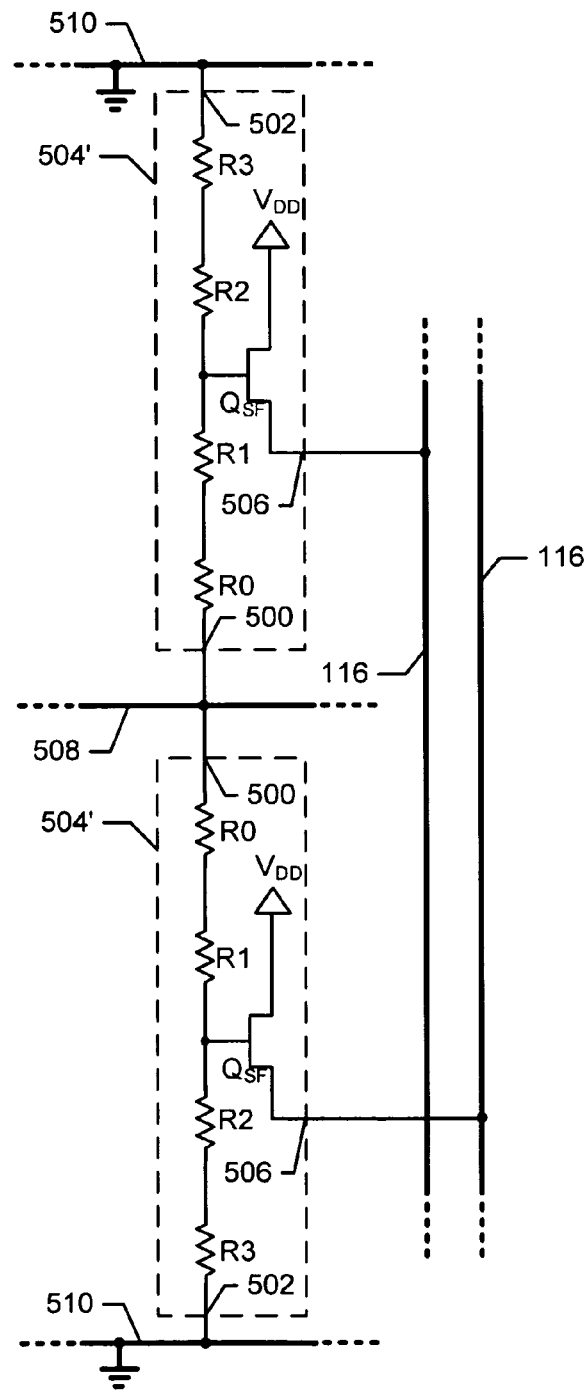
FIG. 5B is a diagram of a set of memory cell strings in accordance with another implementation of the present invention.

FIG. 5A is a diagram of a memory cell string 504 in accordance with one implementation of the present invention. Memory cell string 504 is similar to the example memory cell string in FIG. 4A but used differently as illustrated in FIG. 5B. In this example, memory cell string 504 includes a voltage divider formed by four resistors R0–R3. Resistor R0 is coupled to voltage divider input 500 and to resistor R1. Resistor R1 is coupled jointly to the gate of source-follower transistor $Q_{SF}$ and to resistor R2. Resistor R2 is coupled to resistor R3, which is coupled to voltage divider ground 502. The drain of transistor $Q_{SF}$ is coupled to VDD and its source is coupled to bit-sense output 506.

Resistors R0–R3 represent the resistances of the insulating tunneling barriers of the four magnetoresistive memory cells forming memory cell string 504. As previously described, the resistance of a magnetoresistive memory cell depends upon the state of the bit stored therein. Different bit states cause voltage variations at the junction of resistors R1 and R2. The gate of transistor $Q_{SF}$ senses the voltage variation and transfers it to its source, which is coupled to bit-sense output 506.

FIG. 5B is a diagram of a set of memory cell strings 504' in accordance with another implementation of the present invention. Each memory cell string 504 in the set has an individual bit-sense line 116 rather than sharing a bit-sense line as in the previous example in FIG. 4B. The set of memory cell strings 504' can be fabricated more densely in situations that favor having a shared switched voltage line 508 and individual bit-sense line 116. Accordingly, the voltage divider inputs 500 of the set of memory cell strings 504' are coupled to shared switched voltage line 508 that is capable of applying a voltage to the set of memory cell string voltage divider inputs 500. Applying a voltage to the voltage divider input selects the set of memory cell strings 504' rather than one memory cell 504. The voltage divider ground of each memory cell string 504 in the set is operatively coupled to a ground 510. Each individual bit-sense line 116 is operatively coupled to the bit-sense output 506 each memory cell string 504 in the set.

In one implementation, the set of memory cell strings 504' is arranged in a matrix of rows and columns. In the matrix, individual bit-sense line 116 is operatively coupled to bit-sense outputs 506 of memory cell strings along a column of the matrix. Also in the matrix, shared switched voltage line 508 is operatively coupled to voltage divider inputs 500 of memory cell strings along a row of the matrix. Individual bit-sense line 116 may be operatively coupled to a sense amplifier, or multiple individual bit-sense lines 116 may be operatively coupled to a sense amplifier through a multiplexer. Unselected switched voltage lines 508 are set to ground potential in one implementation of the present invention.

Figure 6A:
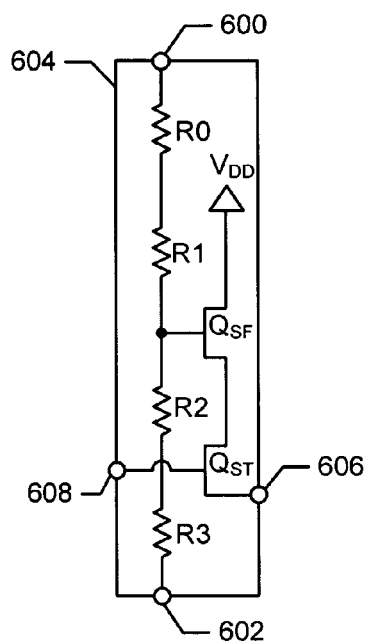
FIG. 6A is a diagram of a memory cell string in accordance with another implementation of the present invention.

FIG. 6A is a diagram of a memory cell string 604 in accordance with another implementation of the present invention. Memory cell string 604 is similar but not identical to memory cell string 404 and memory cell string 505 illustrated and described in accordance with FIG. 4A and FIG. 5A respectively. In this example, memory cell string 604 includes a voltage divider formed by four resistors R0–R3. Resistor R0 is coupled to voltage divider input 600 and to resistor R1. Resistor R1 is coupled jointly to the gate of source-follower transistor $Q_{SF}$ and to resistor R2. Resistor R2 is coupled to resistor R3, which is coupled to voltage divider ground 602. The drain of transistor $Q_{SF}$ is coupled to VDD and its source is coupled to the drain of series-switch transistor $Q_{ST}$. The source of transistor $Q_{ST}$ is coupled to bit-sense output 606 and its gate is coupled to bit-sense output control 608.

Resistors R0–R3 represent the resistances of the insulating tunneling barriers of the four magnetoresistive memory cells forming memory cell string 604. As previously described, the resistance of a magnetoresistive memory cell depends upon the state of the bit stored therein. Different bit states cause voltage variations at the junction of resistors R1 and R2. The gate of transistor $Q_{SF}$ senses the voltage variation and transfers it to its source, which is coupled to the drain of series-switch transistor $Q_{ST}$. Activating bit-sense output control 608 causes transistor $Q_{ST}$ to switch the voltage from the source of transistor $Q_{SF}$ to bit-sense output 606.

Figure 6B:
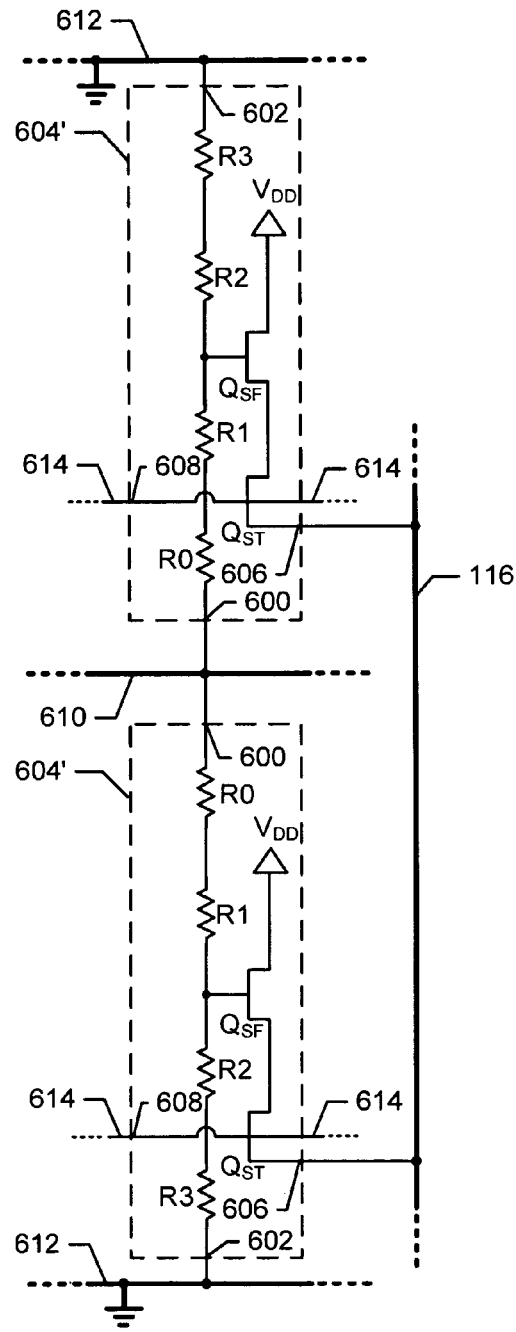
FIG. 6B is a diagram of a set of memory cell strings in accordance with yet another implementation of the present invention.

FIG. 6B is a diagram of a set of memory cell strings 604' in accordance with yet another implementation of the present invention. The design of memory cell string 604 facilitates having both a shared switched voltage line 610 and a common bit-sense line 116. Even higher density designs are possible using the design of memory cell string 604 to eliminate both additional voltage lines and bit-sense lines. Here, the voltage divider inputs of memory cell strings 604' are coupled to shared switched voltage line 610 that is capable of applying a voltage to the voltage divider inputs of the memory cell strings in the set. Applying a voltage to the voltage divider input selects the set of memory cell strings 604'. The voltage divider ground of each memory cell string 604 in the set is operatively coupled to a ground 612. Common bit-sense line 116 is operatively coupled to the bit-sense outputs 606 set of memory cell strings 604'. A bit-sense output control line 614 that is capable of selectively connecting bit-sense output 606 to common bit-sense line 116 is connected bit-sense output control 608.

In one implementation, the set of memory cell strings 604' is arranged in a matrix of rows and columns. In the matrix, common bit-sense line 116 is operatively coupled to bit-sense outputs 606 along a column of the matrix. Also in the matrix, shared switched voltage line 610 is operatively coupled to voltage divider inputs 600 of memory cell strings along a row of the matrix. Additionally, bit-sense output control line 614 is operatively coupled to bit-sense output controls 608 along a row of the matrix. Common bit-sense line 116 may be operatively coupled to a sense amplifier, or multiple common bit-sense lines 116 may be operatively coupled to a sense amplifier through a multiplexer. Unselected switched voltage lines 610 are set to ground potential.

Figure 7:
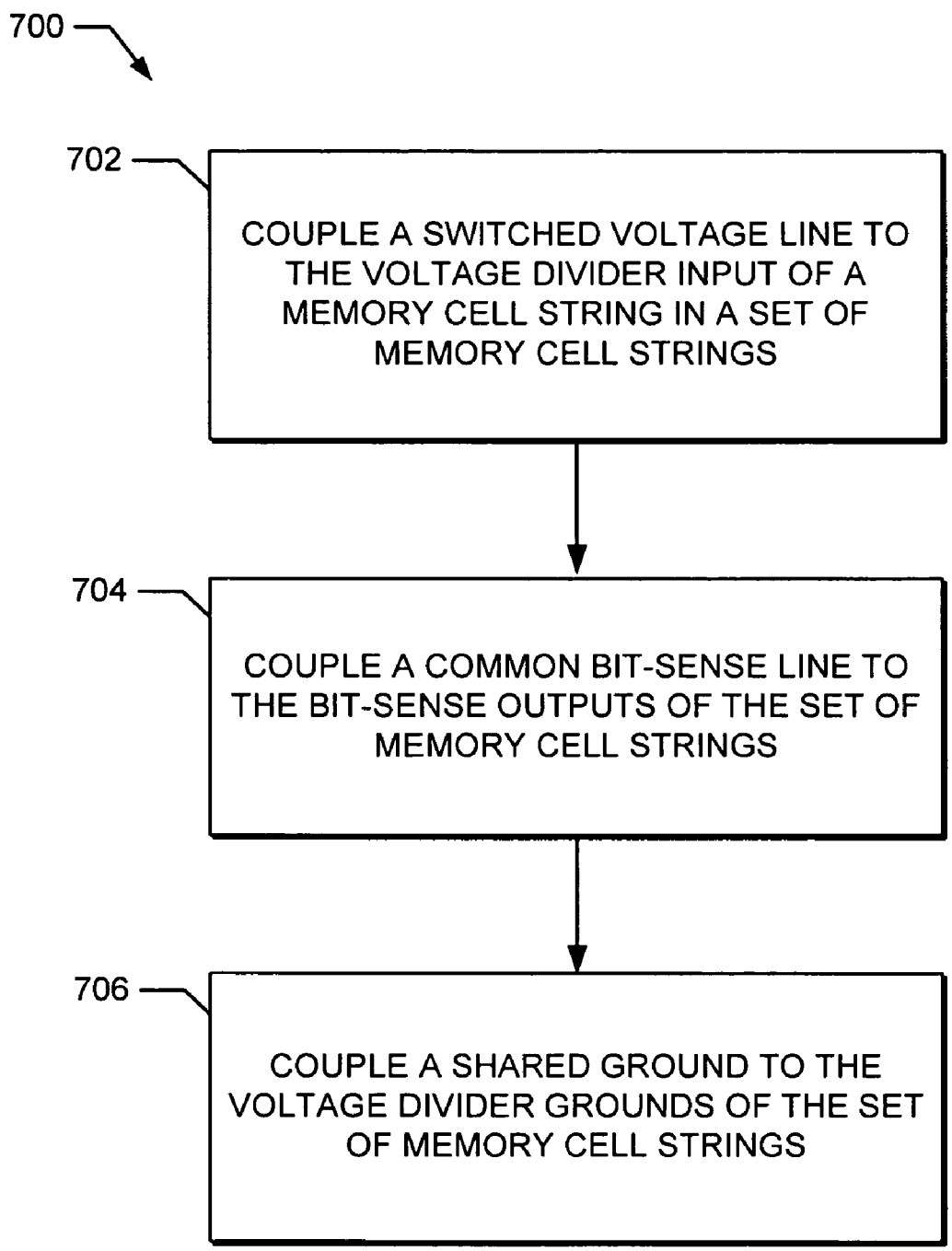
FIG. 7 is a flowchart diagram of the operations pertaining to fabricating an MRAM memory array in accordance with one implementation of the present invention.

FIG. 7 is a flowchart diagram 700 of the operations pertaining to fabricating an MRAM memory array in accordance with one implementation of the present invention. The MRAM memory array includes a set of memory cell strings wherein each memory cell string has a voltage divider input, a bit-sense output, and a voltage divider ground. The operation begins by coupling a switched voltage line to the voltage divider input of a memory cell string in the set of memory cell strings (702). The next operation involves coupling a common bit-sense line to the bit-sense outputs of the set of memory cell strings (704). The final operation in flowchart diagram 700 involves coupling a ground to the voltage divider grounds of the set of memory cell strings (706).

Figure 8:
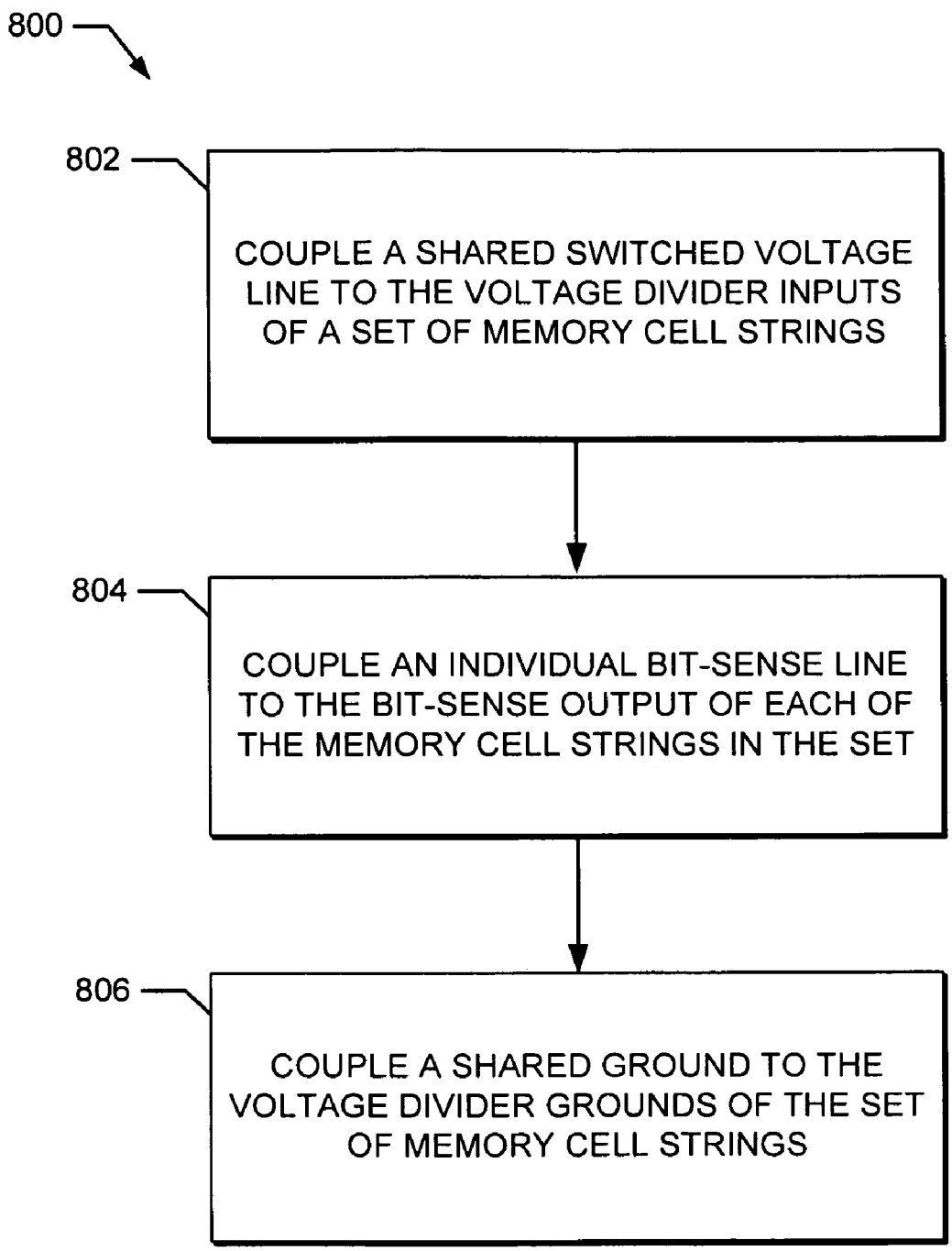
FIG. 8 is a flowchart diagram of the operations pertaining to fabricating an MRAM memory array in accordance with another implementation of the present invention.

FIG. 8 is a flowchart diagram 800 of the operations pertaining to fabricating an MRAM memory array in accordance with another implementation of the present invention. The MRAM memory array includes a set of memory cell strings wherein each memory cell string has a voltage divider input, a bit-sense output, and a voltage divider ground. The operation begins by coupling a shared switched voltage line to the voltage divider inputs of the set of memory cell strings (802). The next operation involves coupling an individual bit-sense line to the bit-sense output of each of the memory cell strings in the set (804). The final operation in flowchart diagram 800 involves coupling a ground to the voltage divider grounds of the set of memory cell strings (806).

Figure 9:
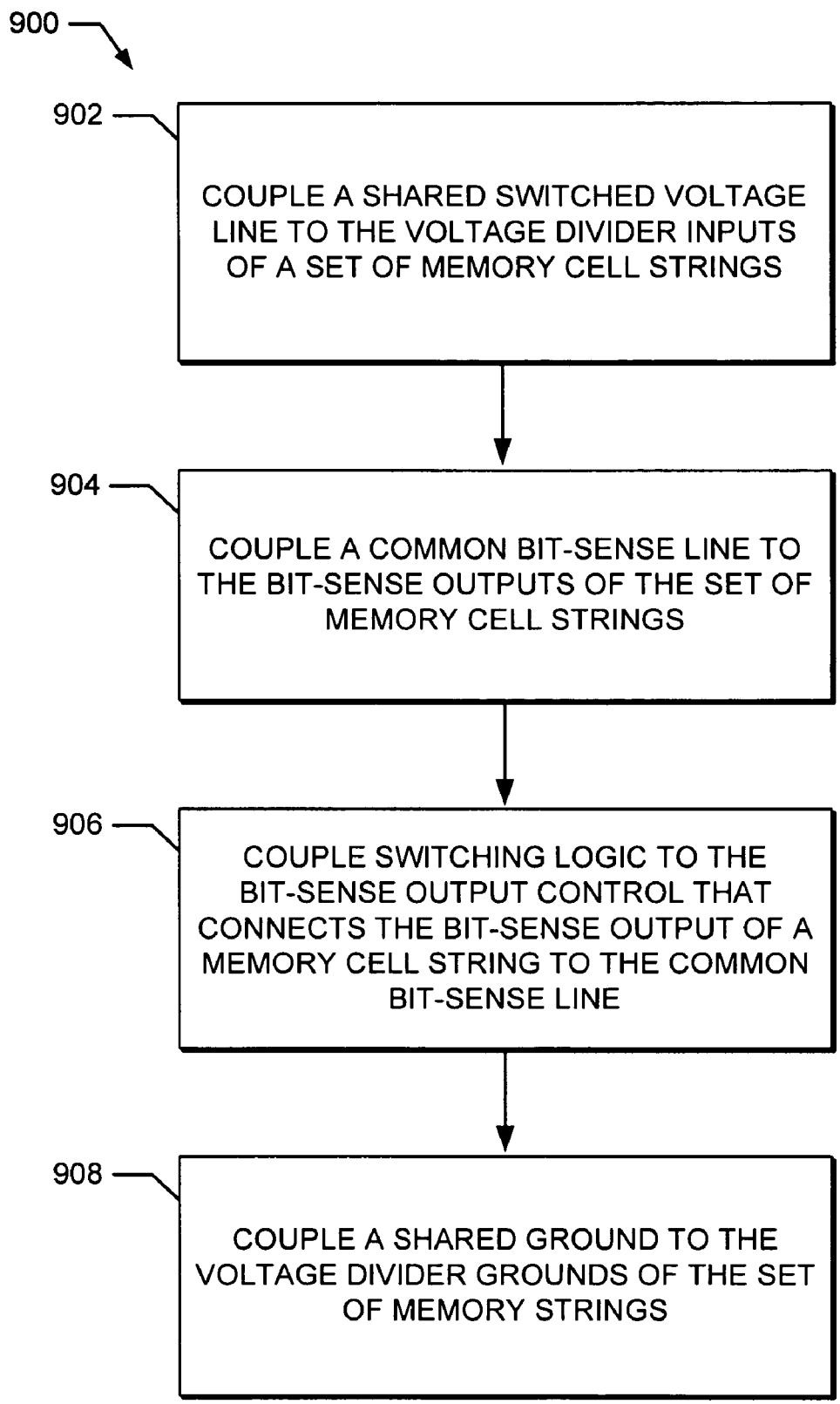
FIG. 9 is a flowchart diagram of the operations pertaining to fabricating an MRAM memory array in accordance with yet another implementation of the present invention.

FIG. 9 is a flowchart diagram 900 of the operations pertaining to fabricating an MRAM memory array in accordance with yet another implementation of the present invention. The MRAM memory array includes a set of memory cell strings wherein each memory cell string has a voltage divider input, a bit-sense output, a voltage divider ground, and a bit-sense output control. The operation begins by coupling a shared switched voltage line to the voltage divider inputs of the set of memory cell strings (902). The next operation involves coupling a common bit-sense line to the bit-sense outputs of the set of memory cell strings (904). After that, the next operation involves coupling a bit-sense output control line to the bit-sense output control that connects the bit-sense output of a memory cell string to the common bit-sense line (906). The final operation in flowchart diagram 900 involves coupling a ground to the voltage divider grounds of the set of memory cell strings (908).

While specific embodiments have been described herein for the purposes of illustration, various modifications may be made without departing from the spirit and scope of the invention. Accordingly, the invention is not limited to the above-described implementations, but instead is defined by the appended claims in light of their full scope of equivalents.

What is claimed is:

1. An MRAM memory array, comprising:
    a set of memory cell strings wherein each memory cell string has a voltage divider input, a bit-sense output, and a voltage divider ground and wherein the set of memory cell strings is arranged in a matrix of rows and columns;
    a switched voltage line that is capable of applying a voltage to the voltage divider input of a memory cell string, whereupon application of the voltage selects the memory cell string and wherein the switched voltage line is operatively coupled to the voltage divider inputs of memory cell strings along a row of the matrix;
    a common bit-sense line operatively coupled to the bit-sense outputs of the set of memory cell strings; and
    a ground operatively coupled to the voltage divider grounds of the set of memory cell strings.

2. The MRAM memory array of claim 1 wherein the common bit-sense line is operatively coupled to the bit-sense outputs of memory cell strings along a column of the matrix.

3. The MRAM memory array of claim 1 wherein the common bit-sense line is operatively coupled to a sense amplifier.

4. The MRAM memory array of claim 1 wherein multiple common bit-sense lines are operatively coupled to a sense amplifier through a multiplexer.

5. The MRAM memory array of claim 1 wherein the switched voltage line is set to ground for unselected memory cell strings.

6. A method of fabricating an MRAM memory array comprising a set of memory cell strings wherein each memory cell string has a voltage divider input, a bit-sense output, and a voltage divider ground and wherein the set of memory cell strings is arranged in a matrix of rows and columns, the method comprising:
    coupling a switched voltage line to the voltage divider inputs of memory cell strings along a row of the matrix;
    coupling a common bit-sense line to the bit-sense outputs of the set of memory cell strings; and
    coupling a ground to the voltage divider grounds of the set of memory cell strings.

* * * * *